United States Patent
Kawaguchi et al.

(10) Patent No.: US 7,135,816 B2
(45) Date of Patent: Nov. 14, 2006

(54) COLOR CONVERSION FILTER AND COLOR CONVERSION COLOR DISPLAY HAVING THE SAME

(75) Inventors: Koji Kawaguchi, Kanagawa (JP); Yotaro Shiraishi, Kawasaki (JP); Yukinori Kawamura, Kanagawa (JP)

(73) Assignee: Fuji Electric Co., Ltd., Kawasaki (JP)

( * ) Notice: Subject to any disclaimer, the term of this patent is extended or adjusted under 35 U.S.C. 154(b) by 41 days.

(21) Appl. No.: 10/368,367

(22) Filed: Feb. 20, 2003

(65) Prior Publication Data
US 2004/0164672 A1 Aug. 26, 2004

(51) Int. Cl.
*H01J 1/62* (2006.01)
(52) U.S. Cl. ...................... 313/506; 313/507; 313/498; 313/501; 313/112
(58) Field of Classification Search ............. 313/498, 313/501, 506, 507, 112; 428/690, 917; 359/885; 252/582
See application file for complete search history.

(56) References Cited

U.S. PATENT DOCUMENTS

| | | | | |
|---|---|---|---|---|
| 5,909,081 A | * | 6/1999 | Eida et al. ........... | 313/504 |
| 6,563,263 B1 | * | 5/2003 | Kawaguchi et al. ....... | 313/509 |
| 6,576,352 B1 | * | 6/2003 | Hirai ..................... | 428/690 |
| 6,589,672 B1 | * | 7/2003 | Kobayashi et al. ........ | 428/690 |
| 6,600,535 B1 | * | 7/2003 | Tsuda et al. ............. | 349/113 |

FOREIGN PATENT DOCUMENTS

| | | | |
|---|---|---|---|
| JP | 5-198921 | | 8/1993 |
| JP | 5-258860 | | 10/1993 |
| JP | 09-106888 | | 4/1997 |
| JP | 9-245511 | | 9/1997 |
| JP | 2000-91071 | | 3/2000 |
| JP | 2000-119645 | | 4/2000 |
| JP | 2002-184576 | * | 6/2002 |
| JP | 2002-216962 | * | 8/2002 |
| JP | 2002-124382 | * | 4/2004 |

* cited by examiner

*Primary Examiner*—Nimeshkumar D. Patel
*Assistant Examiner*—Holly Harper
(74) *Attorney, Agent, or Firm*—Manabu Kanesaka

(57) ABSTRACT

A color conversion filter substrate includes a transparent support substrate, one or more types of color conversion layers with a thickness more than 5 μm formed on the support substrate in a desired pattern, and a protective layer formed of a transparent material for covering the support substrate and the color conversion layers and having a flat surface. After a display is produced, the color conversion pattern layers contain unsaturated functional groups at a concentration equal to or less than $1.4 \times 10^{-3}$ mol/g.

4 Claims, 2 Drawing Sheets

COLOR CONVERSION FILTER AND COLOR CONVERSION COLOR DISPLAY HAVING THE SAME

BACKGROUND OF THE INVENTION AND RELATED ART STATEMENT

The present invention relates to a color conversion filter substrate for displaying multiple colors with high definition, good environmental resistance, and high productivity, and to an organic multicolor emitting display device provided with such a filter substrate. More specifically, the present invention relates to a color conversion filter substrate and an organic multicolor emitting display device provided with such a filter substrate, especially an organic multicolor emitting display device using a color conversion method, for a display of electronic and electric equipment such as an image sensor, a personal computer, a word processor, a television, a fax machine, an audio equipment, a video equipment, a car navigation system, an electric desk top calculator, a telephone, a portable terminal, or an industrial instrument.

Since Tang et al. reported that a layered EL showed a high luminance of 1000 cd/m$^2$ at an applied voltage of 10 V (Appl. Phys. Lett., 51, 913 (1987)), a great effort has been made to develop organic EL devices for a practical use. The organic EL device is a thin film self-emission element and provides a high current density at a low voltage. Therefore, it is expected to apply the organic EL device to a flat panel display.

Tohoku Pioneer Corporation has already developed products including vehicle-mounted green monochrome organic EL displays since November 1997. In order to meet the society needs, it is desirable to develop improved organic EL displays that can display multiple colors or full colors.

A method of displaying multiple or full colors with the organic EL display includes methods disclosed in Japanese Patent Publications No. 57-167487, No. 58-147989, and No. 03-214593, in which light emitting elements of the three primary colors (red, green, and blue) are arranged in a matrix form. In a case that the organic light emitting device is used to provide a multicolor display, it is necessary to arrange three types of light-emitting materials (R, G, and B) in a matrix form with high precision, thereby making it technically difficult to produce and increasing a cost. Further, the three types of light-emitting materials have different life times, thereby shifting a color of the display with time.

In Japanese Patent Publications No. 01-315988, No. 02273496, and No. 03-194895, a method in which a color filter and a backlight emitting white light are used to display the three primary colors through the filter has been disclosed. However, it is difficult to obtain an organic light emitting device emitting the white light with a long life, which is necessary to obtain bright three colors R, G, and B.

Japanese Patent Publication No. 03-152897 has disclosed another method in which phosphors arranged on a plane absorb light from light emitting devices, so that the phosphors emit fluorescence in multiple colors. Such a method using a certain luminous device to allow the phosphors to emit fluorescence in multiple colors has been applied to CRTs, plasma displays, and the like.

Further, in recent years, a color conversion method has been proposed in which a filter is composed of a fluorescent material for absorbing light with a wavelength in a light-emission region of an organic light emitting device, so that the fluorescent material emits fluorescence with a wavelength in a visible light region (Japanese Patent Publications No. 03-152897 and No. 05-258860). In this approach, an organic light emitting device that emits a color other than white can be used. Therefore, it is possible to use an organic light emitting device with higher brightness as a light source. In a color conversion method using an organic light emitting device emitting blue light (Japanese Patent Publications No. 03-152897, No. 08-286033, and No. 09-208944), a frequency of blue light is converted to that of green or red light. A color conversion filter containing a fluorescent material with such color conversion effect may be formed in a high resolution pattern. Accordingly, it is possible to provide a full-color light emitting display even with weak energy light such as near-ultraviolet light or visible light.

In order to form a pattern of the color conversion filter, a method in which a pattern is formed with a photolithography process after a film of a resist (photosensitive polymer) material containing fluorescent material is prepared by spin-coating has been disclosed in Japanese Patent Publications No. 05-198921 and No. 05-258860. Also, Japanese Patent Publication No. 09-208944 has disclosed a process in which a fluorescent material or fluorescent pigment is dispersed in a basic binder followed by etching the binder with an acid solution. The former method has been preferred because a manufacturing process is simple and the pattern formation exhibits good reproducibility.

For a practical application, it is necessary for a color display to possess long-term stability as well as high definition colors. However, in the organic EL devices using the color conversion filters, light-emission characteristics such as a current-luminance characteristic tend to degrade markedly after a specific period of time. A major cause of the degraded light-emission characteristics is degradation of the conversion capability of the color-converging filter associated with drive of the device.

A cause for the degraded conversion capability of the color conversion filter includes decomposition and quenching of fluorescent pigments caused by radicals. When a matrix resin is formed by using a resist, radicals are generated from photo-polymerization initiators and/or thermo-polymerization initiators (curing agent) contained in the resist, or growth radicals are generated from reactive mono-functional and/or multi-functional monomers and oligomers. As a result, it is known that the radicals can attack the filter to thereby decompose and/or quench the organic fluorescent pigment. In fact, the inventors confirmed that when the color conversion filter was formed in a pattern through position-selective curing of the resist into a matrix resin, the conversion capability was deteriorated due to light irradiation in an exposure step or thermal stress in a drying step.

Furthermore, after the color conversion filter is formed in a pattern, unreacted photo-polymerization initiators and/or thermo-polymerization initiators or unreacted reactive mono-functional and/or multi-functional monomers and oligomers may remain in the patterned film. In such a case, external light or light from the device can generate radicals from the unreacted substances, thereby degrading the conversion capability of the color conversion filter. That is, driving the device may degrade the conversion capability of the color conversion filter.

Another cause for the degraded conversion capability of the color conversion filter is a decrease in a fluorescent quantum yield resulting from a change in a dielectric constant of the matrix resin near the fluorescent pigment. It is generally known that a dielectric constant of a substance decreases as a cross-link reaction of the resist progresses. For example, methylmethacrylate (monomer) has a dielectric constant of 4.0. However, when it is polymerized and solidified, the resulting poly-methylmethacrylate has a reduced dielectric constant of 2.9.

That is, an environment of the fluorescent pigment is changed through an interaction between the organic fluorescent pigment molecules and the cross-linked matrix resin. As a result, the fluorescent quanta yield decreases. Also in this case, when unreacted photo-polymerization initiators and/or thermo-polymerization initiators or unreacted reactive mono-functional and/or multi-functional monomers and oligomers remain in the patterned film, driving the device causes the cross-link reaction of the resist, thereby degrading the conversion capability of the color conversion filter.

It is therefore an object of the present invention to provide a color conversion filter exhibiting such stable performance that the conversion capability remains unreacted in the long-term drive of the device.

Further objects and advantages of the invention will be apparent from the following description of the invention.

SUMMARY OF THE INVENTION

The inventors conducted thorough studies on a basis that a cross-linking reaction of a resist in the color conversion filter may affect a conversion capability of a color conversion filter. As a result, the inventors have found that reactivity of the resist significantly affects stability of the color conversion filter associated with driving of a device. In order to achieve the above objects, according to the present invention, a concentration of unsaturated functional groups contained in a color conversion layer is controlled to be $1.4 \times 10^{-3}$ mol/g or less after a display is formed.

DETAILED DESCRIPTION OF PREFERRED EMBODIMENTS

Hereunder, embodiments of the present invention will be described with reference to the accompanying drawings.

Figure 1:
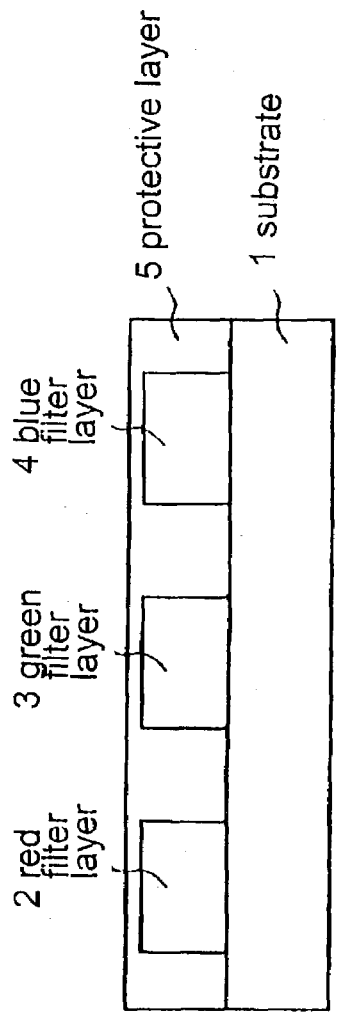
FIG. 1 is a schematic diagram showing a sectional view of a color conversion filter substrate.

FIG. 1 shows a sectional view of a color conversion filter corresponding to a single pixel according to the present invention. A red conversion layer 2, a green conversion layer 3, and a blue filter layer 4 are arranged on a support substrate 1. A protective layer 5 is arranged to cover the conversion layers and filter layer.

In the present invention, an organic fluorescence colorant constituting a color conversion filter layer absorbs light with a wavelength in a near-ultraviolet or visible region emitted by a luminous device, especially light with a wavelength in a blue or bluish green region, to emit another visible light. It is preferred that one or more types of fluorescence colorants emitting at least fluorescence with a wavelength in the red region are used, and may be combined with one or more types of fluorescence colorants emitting fluorescence with a wavelength in a green region.

In a case that an organic light emitting device that emits light with a wavelength in the blue or bluish-green region is used, when the light is converted to light with a wavelength in the red region through a simple red filter, an intensity of the light is greatly reduced due to a small amount of red light in the original light. It is possible to obtain high intensity light with a wavelength in the red region by using a fluorescence colorant to convert light from the organic light emitting device into light with a wavelength in the red region.

It is possible to obtain light with a wavelength in the green region by using another organic fluorescence colorant to convert light from the organic light emitting device into light with a wavelength in the green region. Alternatively, the light from the light emitting device may pass through a green filter to obtain green light when the light from the organic light emitting device contains a sufficient amount of light with a wavelength in the green region.

As for light with a wavelength in the blue region, an organic fluorescence colorant may be used to convert light from the organic light emitting device. It is preferred that the light from the organic light emitting device passes through a blue filter to obtain light with a wavelength in the blue region.

The fluorescence colorants that absorb light with a wavelength in the blue or bluish-green region emitted from the luminous device to emit fluorescence with a wavelength in the red region includes, for example, rhodamine-based colorants such as rhodamine B, rhodamine 6G, rhodamine 3B, rhodamine 101, rhodamine 110, sulforhodamine, basic violet 11, and basic red 3, cyanine-based colorants, pyridine-based colorants such as 1-ethyl-2-[4(p-dimethylaminophenyl)-13-butadienyl]-pyridium-perchlorate (pyridine 1), and oxazine-based colorants. Furthermore, various dyes (direct dyes, acid dyes, basic dyes, disperse dyes, etc.) can be used provided that they are fluorescent.

The fluorescence colorants that absorb light with a wavelength in the blue or bluish-green region emitted from the luminous device to emit fluorescence with a wavelength in the green region includes, for example, coumarin-based colorants such as 3-(2'-benzothiazolyl)-7-diethylaminocoumarin (coumarin 6), 3(2'-(benzimidazolyl)-7-N,N-diethylaminocoumarin (coumarin 7), 3(2'-N-methylbenzimidazolyl)-7-N,N-diethylaminocoumarin (coumarin30), and 2,3,5,6-1H,4H-tetrahydro-8-trifluoromethylquinolizino (9,9a,1-gh) coumarin (coumarin 153), basic yellow 51 as a coumarin colorant-based dye, and naphthalimide-based colorants such as solvent yellow 11 and solvent yellow 116. Furthermore, various dyes (direct dyes, acid dyes, basic dyes, disperse dyes, etc.) can be used provided that they are fluorescent.

The organic fluorescence colorants may be formed in an organic fluorescent pigment by blending in advance into a resin such as polymethacrylate, polyvinyl chloride, vinyl chloridevinyl acetate copolymer, alkyd resin, aromatic sulfonamide resin, urea resin, melamine resin, benzoguanamine resin, and a mixture of these resins. Further, these types of organic fluorescence colorants or organic fluorescent dyes (in the specification, these are collectively referred as organic fluorescence colorants) may be used solely, or two or more types of such colorants may be combined together in order to adjust hue of the fluorescence. According to the present invention, the device contains 0.01 to 5 wt %, more preferably 0.1 to 2 wt %, of such an organic fluorescence colorant with reference to a weight of a fluorescence color conversion film. When the device contains less than 0.01 wt % of the organic fluorescence colorant, wavelength conversion will not be sufficient. When the device contains more than 5 wt % of the organic fluorescence colorant, the color-conversion efficiency may be decreased due to a concentration quenching effect or the like.

A matrix resin used for the fluorescence color conversion filter layers is a photo-setting or photo- and thermo-setting resin. The matrix resin is cured optically and/or thermally to generate radicals or ion seeds to polymerize and cross-link, thereby obtaining a material that is not soluble and does not melt. It is preferred that the photo-setting resin or photo- and thermo-setting resin is soluble in an organic solvent or an alkali solution before curing so that the fluorescence color conversion film is formed in a pattern.

The photo-setting resin or photo- and thermo-setting resin includes (1) a composition containing an acrylic multifunctional monomer/oligomer having acroyl groups or methacroyl groups and a photo- or thermo-polymerization initiator, wherein the composition is optically or thermally treated to generate optical or thermal radicals for polymerization, (2) a composition containing polyvinyl ester cinnamate and a sensitizer, wherein the composition is thermally treated to produce dimers for cross-linking, (3) a composition containing a linear or cyclic olefin and bisazido, wherein the composition is optically or thermally treated to generate nitrene to cross-link with the olefin, or (4) a composition containing monomers having an epoxy group and a photo oxidizer, wherein the composition is optically or thermally treated to generate acids (cations) for polymerization. In particular, the photo-setting resin or photoand thermo-setting resin of (1) provides high resolution and easy pattern formation, as well as good solvent- and heat-resistance and the like. As described above, the photo-setting resin or photo- and thermo-setting resin is exposed to light, or is subjected under heat to form the matrix resin.

In this specification, the term "unsaturated functional group" refers to carbon-carbon double bonds in the photo-setting resin or photo- and thermal-setting resin as well as all double and triple bonds contained in the polymerization initiators.

The acrylic-based multifunction monomer used in the present invention includes, for example, "V259PA/P5" (trade name; Nippon Steel Chemical Co., Ltd.).

It is preferred that the photo-polymerization initiator used in the present invention initiates the polymerization by light with a wavelength that the fluorescence pigment contained in the initiator does not absorb.

In the light conversion layer according to the present invention, when the photo-setting resin or photo- and thermo-setting resin itself can be polymerized by light or heat, the photo- or thermo-polymerization initiator may be omitted. Furthermore, when it is necessary to adjust the concentration of the unsaturated functional groups in the matrix resin, a promoter may be added for facilitating the photo cross-linking (polymerization) or thermo-polymerization reaction.

A solution or dispersion of the resin is applied to a support substrate to form a resin layer. Then, a desired portion of the photo-setting or photo- and thermo-setting resin is exposed for polymerization to form the matrix resin. It is important to control exposure conditions (irradiation intensity, amount of irradiation, and irradiation wavelength) for adjusting the concentration of the unsaturated functional groups in the matrix resin. An irradiation wavelength suitable for the polymerization is selected based on the type of photo-polymerization initiator or the resin itself contained in the photo-setting or photo- and photo- and thermo-setting resin. The intensity and amount of irradiation are set so that the color conversion film has an unsaturated-functional-group concentration of $1.4 \times 10^{-3}$ mol/g or less. However, in a case that a baking process (described later) is included to facilitate the polymerization of the resin, the intensity and amount of irradiation are set so that an irradiated portion of the resin is insoluble to be formed in a pattern.

Furthermore, a transparent resin film may be formed on the top surface of the outer resin layer for blocking oxygen before the resin is exposed. This approach is particularly effective when the color conversion filter has a thickness more than 5 μm.

As previously described, after the desired portion of the photo-setting or photo- and thermo-setting resin is exposed to become insoluble, the resin is formed in a pattern. A patterning step includes a conventional method in which an unexposed portion of the resin is removed by using an organic solvent or alkali solution that dissolves or disperses the resin.

It is possible to apply heat (baking) to the patterned matrix resin for further polymerization. It is preferred to include the baking process for facilitating the polymerization reaction and removing unreacted small molecular weight components such as monomers. In the baking process, it is possible to adjust the concentration of the unsaturated functional groups in the matrix resin by optimizing such conditions as a heating method, a heating temperature, and a heating time. A conventional heating device such as a wire resistance heater oran infrared lamp can be used in the baking process.

An infrared absorption analysis is used to determine the concentration of the unsaturated functional groups remaining in the matrix resin.

Figure 2:
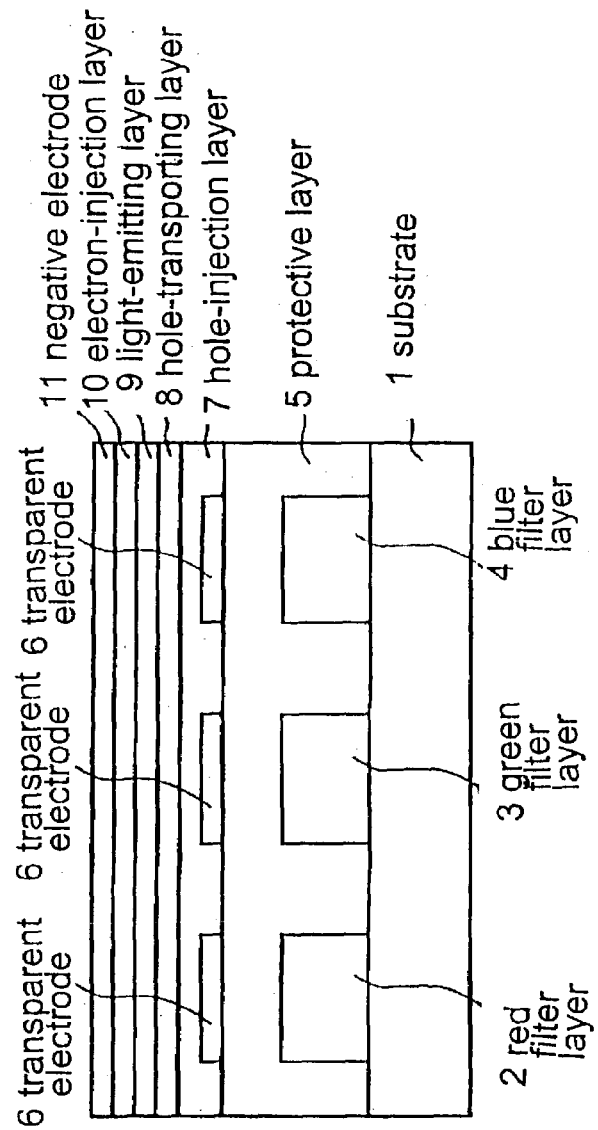
FIG. 2 is a schematic diagram showing a sectional view of an organic multicolor light emitting device.

In the present invention, the protective layer 5 protects the color conversion pattern layers 2, 3, and 4 and provides a flat top surface of the color conversion filter as shown in FIGS. 1 and 2.

A material for the protective layer 5 has high transparency in the visible region (permeability of 50% or greater at a wavelength of 400 nm to 700 nm), a Tg of 100° C. or higher, and a surface hardness of 2H or greater in terms of pencil hardness. The material is formed in a smooth coating film in a order of μm on the color conversion filter, and does not affect the functionality of the color conversion filter layers 2~4. Such a material includes a photo-setting resin and/or a thermo-setting resin such as an imide modified silicone resin (Japanese Patent Publications No. 05-134112, No. 07-218717, and No. 07-306311), an inorganic metal compound (TiO, $Al_2O_3$, $SiO_3$, or the like) dispersed in an acrylic, polyimide, silicone, or other resin (Japanese Patent Publications No. 05-119306 and No. 07-104114), an epoxy-modified acrylatol resin used as an ultraviolet curable resin (Japanese Patent Publication No. 07-48424), a resin having reactive vinyl groups of acrylate monomer/oligomer/polymer, or a resist resin (Japanese Patent Publications No. 06-300910, No. 07-128519, No. 08-279394, and No. 09-330793), or a fluorine-based resin (Japanese Patent Publications No. 05-36475 and No. 09-330793). The protective layer 5 may be formed of an inorganic compound formed by a sol-gel process (Monthly Display, Vol. 3, No. 7, 1997, Japanese Patent Publications No. 08-27394).

The protective layer 5 can be formed with various methods. For example, the layer may be formed with a conventional method such as a dry process (sputtering, vapor deposition, CVD, or the like) or a wet process (spin coating, roll coating, casting, or the like).

Furthermore, an insulating inorganic oxide layer such as silicon oxide or aluminum oxide may be formed on the top surface of the protective layer 5 in order to improve the gas-barrier property of the protective layer.

In the color conversion filter according to the present invention, the support substrate 1 needs to be transparent with respect to light converted by the color conversion film. Further, the support substrate 1 needs to withstand conditions (solvent, temperature, and the like) in the process of forming the color conversion film and protective layer; and moreover, the support substrate 1 is preferably dimensionally stable.

A preferable material for the support substrate 1 includes such a resin as polyethyleneterephthalate and polymethylmethacrylate. A Corning glass is particularly preferable.

According to the present invention, one or more types of color conversion films are formed on the support substrate 1 in a desired pattern to form the color conversion filter. A composition containing the fluorescence pigment and resist is applied on the support substrate 1, and is exposed to the light through a mask of the desired pattern to form the pattern. The substrate may be baked as needed. In producing the color display, three types of color conversion films for red, green, and blue are preferably formed. In a case that a luminous device emitting blue or bluish-green light is used, it is possible to form red and green color conversion films and a blue filter layer. In the specification, the color conversion layers and the filter layers formed in the desired pattern are collectively referred as "color conversion pattern layers."

A pattern of the color conversion pattern layers depends on an application. A set of rectangular or circular areas for red, green, and blue may be produced over an entire support substrate. Alternatively, a set of adjacent and parallel stripes (with a specific width and a length equal to that of the support substrate 1) for red, green, and blue may be produced over the entire support substrate. A color conversion film of a particular color may be formed in a larger area (the number of areas, or a total area) than that of color conversion films of the other colors.

In FIG. 1, the protective layer is provided in between the color conversion pattern layers. As needed, a black layer may be provided instead of the protective layer. In a case that the black layer is provided, it is possible to prevent light from leaking from a luminous device corresponding to the adjacent pixel, or to prevent color conversion by the adjacent luminous device, thereby improving contrast of the color display.

In the color conversion pattern layer used in the present invention, it is preferred that the color conversion film has a thickness of 5 μm or greater.

According to the present invention, the color conversion color display includes the color conversion filter and a luminous device provided on the protective layer 5 of the filter. The luminous device needs to emit light with a wavelength only in the near-ultraviolet or visible region, preferably in the blue or bluish-green region. In the present invention, the luminous device is preferably an organic EL luminous device.

According to the present invention, the organic EL luminous device emits light with a wavelength in the near-ultraviolet or visible region, preferably light with a wavelength in the blue or bluish-green region. The light enters the fluorescence color conversion filter. The Light is then output from the fluorescence color conversion filter layer as visible light with a different wavelength.

The organic EL luminous device is structured so as to sandwich organic luminous layers between a pair of electrodes. As needed, a hole-injection layer or an electron-injection layer is interposed between the luminous layers. The luminous device is composed of layers specified below;
(1) Positive electrode/organic light-emitting layer/negative electrode,
(2) Positive electrode/hole-injection layer/organic light-emitting layer/negative electrode,
(3) Positive electrode/organic light-emitting layer/electron-injection layer/negative electrode,
(4) Positive electrode/hole-injection layer/organic light-emitting layer/electron-injection layer/negative electrode,
(5) Positive electrode/hole-injection layer/hole-transporting layer/organic light-emitting layer/electron-injection layer/negative electrode.

In the layer configurations described above, it is preferred that at least one of the positive and negative electrodes is transparent in the wavelength region of light emitted by the organic luminous device. The light passes through the transparent electrodes and then enters the fluorescence color conversion film. It is known that the positive electrode can be made transparent easily. Thus, in the present invention, the positive electrode is desirably transparent.

A material for each of the layers is well known. For example, in a case that the organic light-emitting layer emits light with a wavelength in the blue or bluish-green region, a material includes benzothiazole-, benzimidazole-, benzoxazolebased fluorescent whitening agent, a metal chelated oxonium compound, a styrylbenzene-based compound, and an aromatic dimethylidine compound.

FIG. 2 is a sectional view showing a whole structure of the organic multicolor light emitting device. FIG. 2 shows a single pixel of the organic multicolor light emitting device having multiple pixels for displaying multicolor or full-color. The organic EL luminous layer is formed of a positive electrode 6 formed on the gas-barrier layer 5 in a pattern and having a transparent electrode such as an ITO; a hole-injection layer 7 for covering the positive electrode 6; a hole-transporting layer 8 formed on the hole-injection layer 7; an organic light-emitting layer 9 formed on the hole-transporting layer 8; an electron-injection layer 10 formed on the organic light-emitting layer 9; and a negative electrode 11 formed on the electron-injection layer 12 and having a metal electrode.

The positive and negative electrodes 6 and 11 may be formed in a parallel stripe pattern, or a cross pattern that the positive electrode 6 crosses the negative electrode 11. In a case of the cross pattern, the organic light emitting device of the present invention can be driven in matrix. That is, when a voltage is applied to a particular stripe of the positive electrode 6 and a particular stripe of the negative electrode 11, light is emitted from the point at which these stripes intersect. Accordingly, light can be emitted from a pixel of the organic light emitting device in which a particular fluorescence color conversion film and/or filter layer is located, when a voltage is applied to selected stripes of the positive and negative electrodes 6 and 11.

Alternatively, the positive electrode 6 may be formed in a uniform plane without a stripe pattern, and the negative electrode 11 may be formed in a pattern corresponding to the pixels. In such a case, switching elements corresponding to the respective pixels may be provided for active matrix driving.

Hereunder, examples of the present invention will be explained with reference to the drawings. FIG. 1 is a sectional view of a color conversion filter in which color conversion layers 2 and 3 formed of red and green dyes or pigments, respectively, and a filter layer 4 formed of a blue dye or pigment are formed on the transparent support substrate 1. The protective layer 5 is formed so as to cover all of these layers. FIG. 2 is a sectional view showing the color conversion color organic EL display in which the organic EL luminous device is stacked on the color conversion filter.

EXAMPLE 1

(Production of Blue Filters) A blue filter material (manufactured by Fuji Hunt Electronics Technology Co., Ltd.; Color Mosaic CB-7001) was coated on a Corning glass (50 mm×50 mm×1.1 mm) as the transparent substrate 1 with the spin-coating process. The film was then patterned with the photolithography to obtain a pattern of the blue filter layer 4 having a line width of 0.1 mm, a pitch of 0.33 mm, and a film thickness of 6 μm.

(Production of Green Conversion Filter Layer) Coumarin 6 (0.7 parts by weight) as the fluorescent colorant was dissolved into 120 parts by weight of propylene glycol monomethyl ethel acetate (PGMEA) as a solvent. Then, 100 parts by weight of the photo-polymerizing resin "V259PA/

P5" (trade name; manufactured by Nippon Steel Chemical Co., Ltd.) was added and dissolved in the mixture to obtain a coating liquid. The coating liquid was applied to the transparent substrate 1 with the spin-coating process. The resulting film was then patterned with the photolithography to obtain a pattern of the green conversion layer 3 (a green conversion filter layer), having a line width of 0.1 mm, a pitch of 0.33 mm, and a film thickness of 10 μm.

After the pattern was formed, the transparent substrate was heated at 200° C. for a predetermined time to adjust the concentration of the unsaturated functional groups in the color conversion layer. An infrared-absorption spectrum method was used to determine the concentration of the functional groups quantitatively. The green conversion layer 3 had $1.1 \times 10^{-3}$ mol/g of the concentration of the unsaturated functional groups after the display was produced.

(Production of Red Conversion Layer) Coumarin 6 (0.6 parts by weight), rhodamine 6G (0.3 parts by weight), and basic violet 11 (0.3 parts by weight) as the fluorescent colorants were dissolved in 120 parts by weight of PGMEA as a solvent. Then, 100 parts by weight of the photopolymerizing resin "V259PA/P5" (trade name; manufactured by Nippon Steel Chemical Co., Ltd.) was added and dissolved in the mixture to obtain a coating liquid. The coating liquid was applied to the transparent substrate 1 with the spin-coating process. The substrate was then patterned with the photolithography to obtain a line pattern of the red conversion layer 2 having a line width of 0.1 mm, a pitch of 0.33 mm, and a film thickness of 10 μm.

After the pattern was formed, the transparent substrate was heated at 200° C. for a predetermined time to adjust the concentration of the unsaturated functional groups in the color conversion pattern layer. The infrared-absorption spectrum method was used to determine the concentration of the functional groups quantitatively. The red conversion layer 2 had $1.2 \times 10^{-3}$ mol/g of the concentration of the unsaturated functional groups after the display was produced.

(Production of Protective Layer) A UV cure resin (epoxy modified acrylate) was applied to the transparent substrate and the color conversion layers with the spin-coating process, and the resulting layer was formed in the protective layer 5 with a thickness of 10 μm with the photolithography, thereby obtaining the color conversion filter. At this time, the color conversion filter layers and the filter layer were not deformed, and a top surface of the protective layer 5 remained flat.

A $SiN_x$ film was deposited on the protective layer 5 with the sputtering process with a thickness of 800 nm to increase the gas barrier property. At this time, when the adhesion between the protective layer and the gas barrier layer ($SiN_x$ film, not shown) was evaluated using the cross-cut adhesion test described in JIS5400, the test result showed good adhesion (>8 points).

(Production of Organic Multicolor Light emitting device) As shown in FIG. 2, six layers were sequentially stacked on the filter produced as described above. The six layers included the positive electrode 6, hole-injection layer 7, hole-transporting layer 8, organic light-emitting layer 9, electron-injection layer 10, and negative electrode 11.

First, a transparent electrode (ITO) was formed on the top surface of the protective layer 6, which is the outermost layer of the color conversion filter, with the sputtering process. After the resist agent "OFRP-800" (trade name; manufactured by Tokyo Ohka Kogyo Co. Ltd.) was applied to the ITO, the resulting layer was patterned with the photolithography to obtain positive electrodes 6 in a stripe pattern with a width of 0.094 mm, a gap of 0.016 mm, and a thickness of 100 nm located at the respective light-emitting sections.

The substrate with the positive electrodes 6 formed thereon was placed in a resistance-heating vapor-deposition apparatus. Then, the hole-injection layer 7, the hole-transporting layer 8, the organic light-emitting layer 9, and the electron-injection layer 10 were sequentially formed on the substrate in a vacuum. During the process of forming the films, an internal pressure of a vacuum chamber was reduced to $1 \times 10^{-4}$ Pa. As the hole-injection layer 7, copper phthalocyanine (CuPc) was stacked in a thickness of 100 nm. As the hole-transporting layer 8 4,4'-bis[N-(1-naphthyl)-N-phenylamino] biphenyl (α-NPD) was stacked in a thickness of 20 nm. As the light-emitting layer 9, 4,4'-bis(2,2-diphenylvinyl) biphenyl (DPVBi) was stacked in a thickness of 30 nm. Furthermore, as the electron-injection layer 10, aluminum chelate (Alq) was stacked in a thickness of 20 nm. Chemical structures of the materials used for these layers are shown in Table 1 below.

TABLE 1

| Layer configuration | Material | Chemical Structure |
|---|---|---|
| Hole-injection layer | Copper phthalocyanine | |

TABLE 1-continued

| Layer configuration | Material | Chemical Structure |
|---|---|---|
| Hole-transporting layer | 4,4'-bis(N-(1-naphthyl)-N-phenylamino) biphenyl | |
| Light-emitting layer | 4,4'-bis(2,2-diphenylvinyl) biphenyl | |
| Electron-transporting layer | Tris (8-hydroxyquinoline) aluminum complex | |

Then, the negative electrode 11 formed of an Mg/Ag (weight ratio: 10 to 1) layer with 200 nm with a thickness was formed by using a mask of a stripe pattern with a width of 0.30 mm and a gap of 0.03 mm perpendicular to the stripes of the positive electrodes (ITO) 6 in the vacuum.

The organic light emitting device thus obtained was sealed in a glove box under a dry-nitrogen atmosphere using a sealing glass (not shown) and a UV cure adhesive, thereby obtaining the color organic EL display with the color conversion method.

EXAMPLE 2

A color conversion color organic EL display was produced in which the green conversion filter had $0.5 \times 10^{-3}$ mol/g of the concentration of the unsaturated functional groups and the red conversion filter had $0.7 \times 10^{-3}$ mol/g of the concentration of the unsaturated functional groups after the display was produced.

EXAMPLE 3

A color conversion color organic EL display was produced in which the green conversion filter had $0.8 \times 10^{-3}$ mol/g of the concentration of the unsaturated functional groups and the red conversion filter had $1.0 \times 10^{-3}$ mol/g of the concentration of the unsaturated functional groups after the display was produced.

EXAMPLE 4

A color conversion color organic EL display was produced in which the green conversion filter had $1.3 \times 10^{-3}$ mol/g of the concentration of the unsaturated functional groups and the red conversion filter had $1.5 \times 10^{-3}$ mol/g of the concentration of the unsaturated functional groups after the display was produced.

COMPARATIVE EXAMPLE 1

A color conversion color organic EL display was produced in which the green conversion filter had $1.5 \times 10^{-3}$ mol/g of the concentration of the unsaturated functional groups and the red conversion filter had $1.6 \times 10^{-3}$ mol/g of the concentration of the unsaturated functional groups after the display was produced.

COMPARATIVE EXAMPLE 2

A color conversion color organic EL display was produced in which the green conversion filter had $1.6 \times 10^{-3}$ mol/g of the concentration of the unsaturated functional groups and the red conversion filter had $1.8 \times 10^{-3}$ mol/g of the concentration of the unsaturated functional groups after the display was produced.

COMPARATIVE EXAMPLE 3

A color conversion color organic EL display was produced in which the green conversion filter had $1.7 \times 10^{-3}$ mol/g of the concentration of the unsaturated functional groups and the red conversion filter had $1.9 \times 10^{-3}$ mol/g of the concentration of the unsaturated functional groups after the display was produced.

Evaluation

The display produced according to the examples and comparative examples were evaluated for an initial green conversion efficiency and red conversion efficiency. Then, all pixels were lit at an initial luminance of 10 cd/m² for 500 hours. After 500 hours, the green and red conversion efficiencies were measured again, thereby obtaining a conversion efficiency retention rate as defined by;

Conversion efficiency retention rate $K(\%) = (T_{500}/T_o) \times 100$ where $T_{500}$ is the conversion efficiency after 500 hours, and $T_o$ is the initial conversion efficiency.

Figure 3:
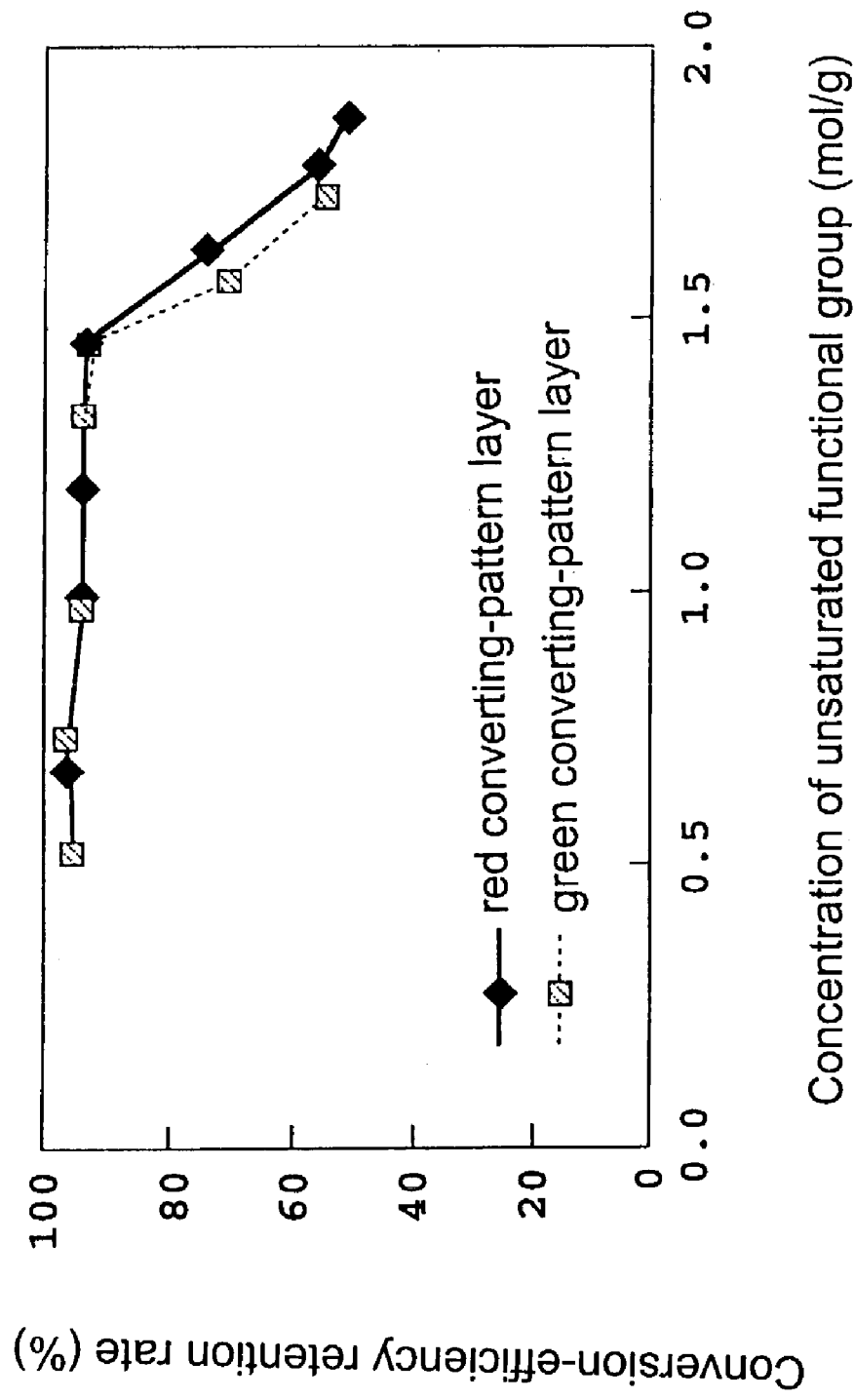
FIG. 3 is a graph showing a relationship between a conversion-efficiency retention rate and a concentration of unsaturated functional groups in a matrix resin.

The results are shown in FIG. 3. It was found that the displays having the concentration of the unsaturated functional groups less than $1.5 \times 10^{-3}$ mol/g exhibited good conversion efficiency retention for both red and green.

As described above, according to the present invention, it is possible to provide the color organic EL display with stable light emission characteristics for an extended period of time with the color conversion filter having a reaction rate of the matrix resin less than the specific value. Therefore, it is possible to provide a reliable color conversion organic EL display having an excellent view-angle characteristic.

While the invention has been explained with reference to the specific embodiments of the invention, the explanation is illustrative and the invention is limited only by the appended claims.

What is claimed is:

1. A color conversion filter, comprising:
    a transparent support substrate,
    at least one color conversion layer formed on the support substrate in a specific pattern, said color conversion layer containing unsaturated functional groups at a concentration equal to or less than $1.4 \times 10^{-3}$ mol/g after the color conversion filter is assembled, and
    a transparent protective layer for covering the color conversion layer and a surface of the transparent support substrate on which the color conversion layer is formed,
    wherein said at least one color conversion layer is formed of an organic fluorescent colorant for absorbing first light with a wavelength in one of a near-ultraviolet region and a visible region to emit second light having a wavelength different from that of the first light, and a matrix resin containing one of a photo-setting resin and a photo-thermo-setting resin for binding the organic fluorescent colorant.

2. A color conversion filter according to claim 1, wherein said at least one color conversion layer has a thickness equal to or greater than 5 μm.

3. A color conversion color display comprising: the color conversion filter according to claim 1, and a luminous device formed on the color conversion filter.

4. A color conversion color display comprising: the color conversion filter according to claim 2, and a luminous device formed on the color conversion filter and including a first electrode layer formed on at least one electrically independent area on the protective layer, a light-emitting layer formed on the first electrode and containing a light-emitting material, and a second electrode layer formed on said at least one electrically independent area on the protective layer so that when an electric signal is sent to the first and second electrode layers, the light-emitting layer between the first and second electrode layers emits light to the color conversion layer through the protective layer, thereby inducing fluorescent-light emission of the organic fluorescent colorant in the color conversion layer for allowing the color conversion color display to display a predetermined color through the support substrate.

* * * * *

UNITED STATES PATENT AND TRADEMARK OFFICE
CERTIFICATE OF CORRECTION

PATENT NO.         : 7,135,816 B2
APPLICATION NO. : 10/368367
DATED               : November 14, 2006
INVENTOR(S)       : Koji Kawaguchi et al.

It is certified that error appears in the above-identified patent and that said Letters Patent is hereby corrected as shown below:

Please change column 1, line 49, "02273496" to -- 02-273496--,

Column 4, line 34, "3(2'-(benzimidazolyl)" to -- 3-(2'-(benzimidazolyl) --,

Column 4, line 35, "3(2'-N-methylbenzimidazolyl)" to -- 3-(2'-N-methylbenzimidazolyl)--, Column 5, line 17, "photoand" to -- photo- and --, and Column 6, line 14, "oran" to -- or an --.

Signed and Sealed this

Sixteenth Day of January, 2007

JON W. DUDAS
*Director of the United States Patent and Trademark Office*